United States Patent [19]

Sakurai

[11] Patent Number: 5,717,573
[45] Date of Patent: Feb. 10, 1998

[54] INTERCONNECTION CARD AND METHODS FOR MANUFACTURING AND CONNECTING THE CARD

[75] Inventor: Keizoh Sakurai, Shiga-ken, Japan

[73] Assignee: International Business Machines Corporation, Armonk, N.Y.

[21] Appl. No.: 511,984

[22] Filed: Aug. 7, 1995

[30] Foreign Application Priority Data

Aug. 5, 1994 [JP] Japan .................... 6-184782

[51] Int. Cl.$^6$ ............................ H05K 1/14; H01L 21/56
[52] U.S. Cl. ...................... 361/737; 361/728; 361/752; 361/790; 437/219
[58] Field of Search ........................ 361/728, 736, 361/737, 748, 752, 790; 437/214, 219

[56] References Cited

U.S. PATENT DOCUMENTS 5,244,840  9/1993  Kodai et al. ........................... 437/214

FOREIGN PATENT DOCUMENTS

| 581 284 A2 | 7/1993 | European Pat. Off. . |
| 63-239093 | 10/1988 | Japan . |
| 2-249981 | 10/1990 | Japan . |
| 6-8681 | 1/1994 | Japan . |
| 6-48078 | 2/1994 | Japan . |
| 6-30859 | 4/1994 | Japan . |

*Primary Examiner*—Leo P. Picard
*Assistant Examiner*—Jayprakash N. Gandhi
*Attorney, Agent, or Firm*—Calfee, Halter & Griswold LLP

[57] ABSTRACT

Both sides of a wiring board have electric components mounted thereon and both sides are supported by bracing pins projecting from the inner surfaces of a metal mold. The mold is filled with resin from a plunger into a cavity formed by a top shell and a bottom shell of the mold, the filling pressure acts to deform the wiring board, but the wiring board 12 is not deformed or damaged, because the board is braced by the supporting pins from both sides. The supporting pins result in holes extending from the surface of the sealing layer to the wiring board after the sealing. Conductive springs are placed in the holes and conductive plates are placed on the top and bottom of the sealing layer with the springs compressed to electrically connect between the wiring board and plates. Alternatively, or in addition to the pins components and/or metal connectors mounted on the wiring board extend to the mold surface to brace the circuit board and provide electrical connection to the wiring board through the components or metal connectors. Metal plates connected to the springs and/or connectors are applied to the surface of the interconnect board.

20 Claims, 10 Drawing Sheets

INTERCONNECTION CARD AND METHODS FOR MANUFACTURING AND CONNECTING THE CARD

FIELD OF THE INVENTION

The present invention is related to interconnection cards in which wiring boards having electric components mounted thereon are sealed within resin, methods for manufacturing such interconnection cards, and connection structures of interconnection cards in which the interconnection cards are placed upon one another for connection.

The following background is for pointing out documents that may be useful to those skilled in the art for implementing the invention and is not an admission regarding priority or a statement that a search has been conducted.

BACKGROUND

For reduction of the number of parts, increase of the bending strength, and increase of the resistance to water and moisture, an interconnection card was proposed in which the electric components connected to a wiring board are sealed with a resin and integrally molded.

published Unexamined patent application Ser. Nos. 63-239093, 2-249981 and 6-48078 official gazettes suggest a method for manufacturing such an interconnection card in which a wiring board, and the electric components mounted on the wiring board are transfer molded.

Published Unexamined Utility Model application Ser. No. 6-30859 and published Unexamined patent application Ser. No. 6-8681 suggest an interconnection card in which a metallic panel is attached to a wiring board through a resin frame to shield the wiring board without using grounding parts. In this interconnection card, electrical conduction is provided between the metallic panel and the wiring board by a metallic spring through an opening provided in the resin frame, but the number of manufacturing processes and the productivity does not increase if such resin frame is separately molded and assembled.

In addition, sometimes interconnection cards are placed upon one another to increase the capacity when used, but, in the conventional interconnection card there is provided a grounding electrode only on one side to allow only one side to be connected and thus there is a need for an effective connection method.

OBJECTS OF THE INVENTION

In view of the above facts, it is the object of the present invention to brace the wiring board to prevent the wiring board from being deformed or damaged by the filling pressure of a resin material when molded, to decrease the number of manufacturing processes, and to allow a three-dimensional electrical connection of interconnection cards.

SUMMARY OF THE INVENTION

The method for manufacturing an interconnection card set forth in claim 1 is characterized by pinching both sides of a wiring board having electric components mounted thereon by means of supports (braces) provided so as to project from the inner surface of a metal mold, and filling a resin into the metal mold to seal both sides of the wiring board with the resin along with the electric components.

The method for manufacturing an interconnection card set forth in claim 2 is characterized by the pressing of the electric components and/or metallic parts mounted on a wiring board against the inner surface of a metal mold, and filling the metal mold with resin to seal both sides of the wiring board with the resin.

The method for manufacturing an interconnection card set forth in claim 3 is characterized by disposing the connector attached to the wiring board in the metal mold for positioning the wiring board.

The method for connection interconnection cards set forth in claim 4 provides wiring board having electric components mounted thereon, a sealing layer for sealing both sides of the wiring board along with the electric components, and holes extending from the surface of the sealing layer to the wiring board, and a terminal is inserted into the holes to enable the electrical connection with both sides of the wiring board through the terminal.

The method for connecting interconnection cards as set forth in claim 5 provides a wiring board having electric components and metallic parts mounted thereon, and a sealing layer for sealing both sides of the wiring board with the electric components or/and the metallic parts being exposed at the surface thereof, and enables the electrical connection with both sides of the wiring board through the electric components or metallic parts.

An interconnection card as set forth in claim 6 provides a wiring board having electric components mounted thereon, a sealing layer for sealing both sides of the wiring board along with the electric components, holes extending from the surface of the sealing layer to the wiring board, a metallic spring to be inserted into the holes, and metallic plates to be applied to the sealing layer with the metallic spring being activated.

An interconnection card as set forth in claim 7 comprises a wiring board having electric components and metallic parts mounted thereon, a sealing layer for sealing both sides of the wiring board with the electric components or/and the metallic parts being exposed at the surface thereof, and metallic plates to be applied to the sealing layer while being put in contact with the electric components or/and the metallic parts.

Operation

In the method for manufacturing an interconnection card set forth in claim 1, both sides of a wiring board having electric components mounted thereon, are pinched by the supports provided so as to project from the inner surface of a metal mold. If the metal mold filled with a resin, the wiring board is deformed by the filling pressure, but it is not deformed or damaged, because the wiring board is pinched from both sides. In addition, the support portions become holes extending from the surface of the resin layer to the wiring board after molding.

In the method for manufacturing an interconnection card set forth in claim 2, the electric components and metallic parts mounted on a wiring board are pressed against the inner surface of a metal mold to hold the wiring board from both sides thereof.. Thus, the wiring board is not deformed by the filling pressure. Further, since no resin creeps around the surface of the electric components and metallic parts pressed against the inner surface of the metal mold, the surface of them is exposed at the surface of the resin layer.

In the method for manufacturing an interconnection card set forth in claim 3, the connector attached to the wiring board is disposed in the metal mold for positioning the wiring board. Further, the connector portion is put in contact with the inner wall of the metal mold to prevent the resin from flowing into the holes provided in the connector. In addition, the positioning of the wiring board is simultaneously performed using the through-hole provided in the wiring board and the supports provided so as to project from the inner surface of the metal mold, there by to prevent the wiring board from laterally moving in the metal mold, so that the connector portion is prevented from departing from the inner surface of the metal mold, and the resin is prevented from flowing into the holes provided in the connector.

In the method for connecting interconnection cards set forth in claim 4, a terminal is inserted into the holes of the interconnection card, and the electrical connection with another interconnection card or electric component is enabled through the terminal. Thus, the inconvenience that only one surface can be connected when the interconnection cards are placed upon on another, as has been in the conventional interconnection cards, is removed and direct connection in allowed through both surfaces.

In the method for connecting interconnection cards set forth in claim 5, both sides of the wiring board are electrically connected through the electric components or metallic parts exposed at the surface of the sealing layer. Accordingly, the inconvenience that only one side can be connected when the interconnection cards are placed upon one another, as has been in the conventional interconnection cards, is removed and direct connection is allowed through both sides.

In the interconnection card set forth in claim 6, a metallic spring is inserted into the holes extending from the surface of the sealing layer to the wiring board, metallic plates are applied to the surfaces of the sealing layer, and the wiring pattern of the wiring board and the metallic plates becoming grounds are connected with the metallic spring being activated. Since the grounding is performed through the metallic spring, the electrical connection is maintained by the activation force even if some gap occurs between the metallic plates and the sealing layer.

In the interconnection card set forth in claim 7, the metallic plates applied to the surfaces of the sealing layer are directly electrically connected to the electric components or/and metallic parts exposed from the surfaces of the sealing layer, thereby to simplify the structure.

LABELS IN THE DRAWINGS

12 Wiring board
14 Electric components
16 Sealing layer
18 Holes
28 Connector
30 Metal mold (top shell)
32 Metal mold (bottom shell)
44 Supporting pins (support)
52 Metallic part (metallic rivet)
54 Metallic part (metallic rivet)
58 Metal mold (top shell)
60 Metal mold (bottom shell)

DETAILED DESCRIPTION OF THE INVENTION

First Embodiment of the Interconnection Card

Figure 1:
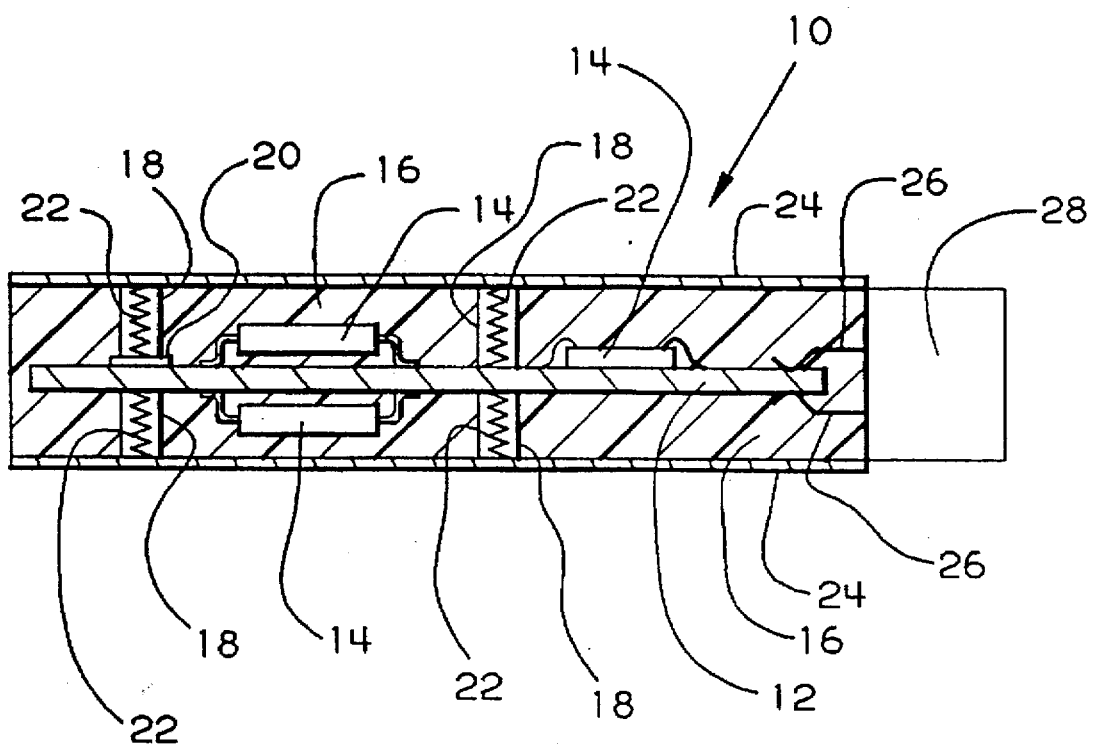
FIG. 1 is a sectional view of the interconnection card related to the first embodiment of the invention.

As shown in FIG. 1, interconnection card 10 related to the first embodiment comprises wiring board 12, and electric components 14 such as interconnection chips mounted on wiring board 12. Wiring board 12 and electric components 14 on both sides thereof integrally sealed with sealing layer 16 to form a thin plate.

The resin material molding sealing layer 16 electrically insulates electric components 14 from each other, and its curing temperature and melting point are lower than the melting point of the connection material for connecting electric components 14 and wiring board 12. This is to prevent the connection portion between electric components 14 and wiring board 12 from being damaged when sealing layer 16 is molded.

In addition, by using a resin material which shrinks when it cures, the connection strength between electric components 14 and wiring board 12 can be increased.

Furthermore, for electric components which emit light, such as light emitting elements, the operation status can be determined from the outside by using a transparent resin material.

In sealing layer 16, holes 18 extending from the surface and rear thereof to wiring board 12 are formed. On the exposed surface of wiring board 12 communicating with the outside through hole 18, ground electrode 20 is disposed, and both ends thereof are sealed with sealing layer 16.

Into holes 18 is inserted metallic spring 22, and metallic sheath plates 24 are applied to both surfaces of sealing layer 16 with metallic spring 22 being compressed between wiring board 12 and plates 24. By this, metallic sheath plates 24 as the ground and wiring board 12 are electrically connected to act as an electromagnetic shield so that the disturbance components from the outside can be removed, and the charged on wiring board 12 are discharged.

Although metallic springs 22 are used in this embodiment, a conductive resin or the like may be used as long as it is a conductor. However, to secure the connection, an elastic body is preferably used which can be activated to maintain the connection strength to be constant, such as metallic springs 22. In addition, four metallic springs 22 are used for connection to metallic sheath plates 24 as the ground, but this is only an example, and it is only needed to increase or decrease the number of contacts as necessary.

On the other hand, connector 28 is connected to the right end of wiring board 12 through pair of metallic pieces 26.

The pair of metallic pieces 26 is sealed integrally with wiring board 12 with sealing layer 16, and connector 28 is set to have the same thickness as sealing layer 16.

Manufacturing the First Embodiment

Figure 2:
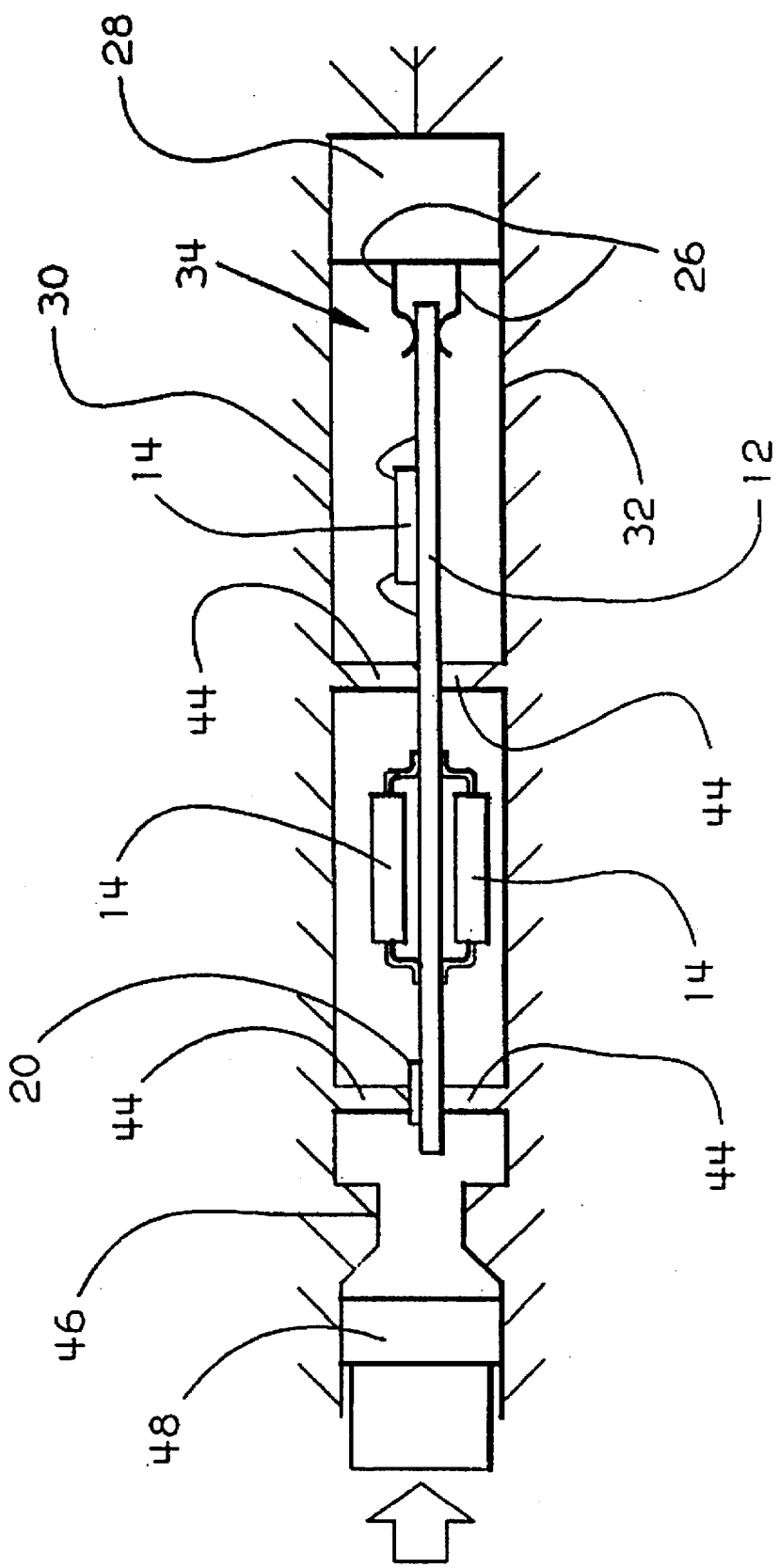
FIG. 2 is a sectional view showing the method for manufacturing the interconnection card related to the first embodiment.

As shown in FIG. 2, by top shell 30 and bottom shell 32, cavity 34 for molding sealing layer 16 sealing the upper side and the underside of wiring board 12 is formed. Connector 28 is placed in cavity 34, and metallic pieces 26 support the right end of wiring board 12.

Figure 3:
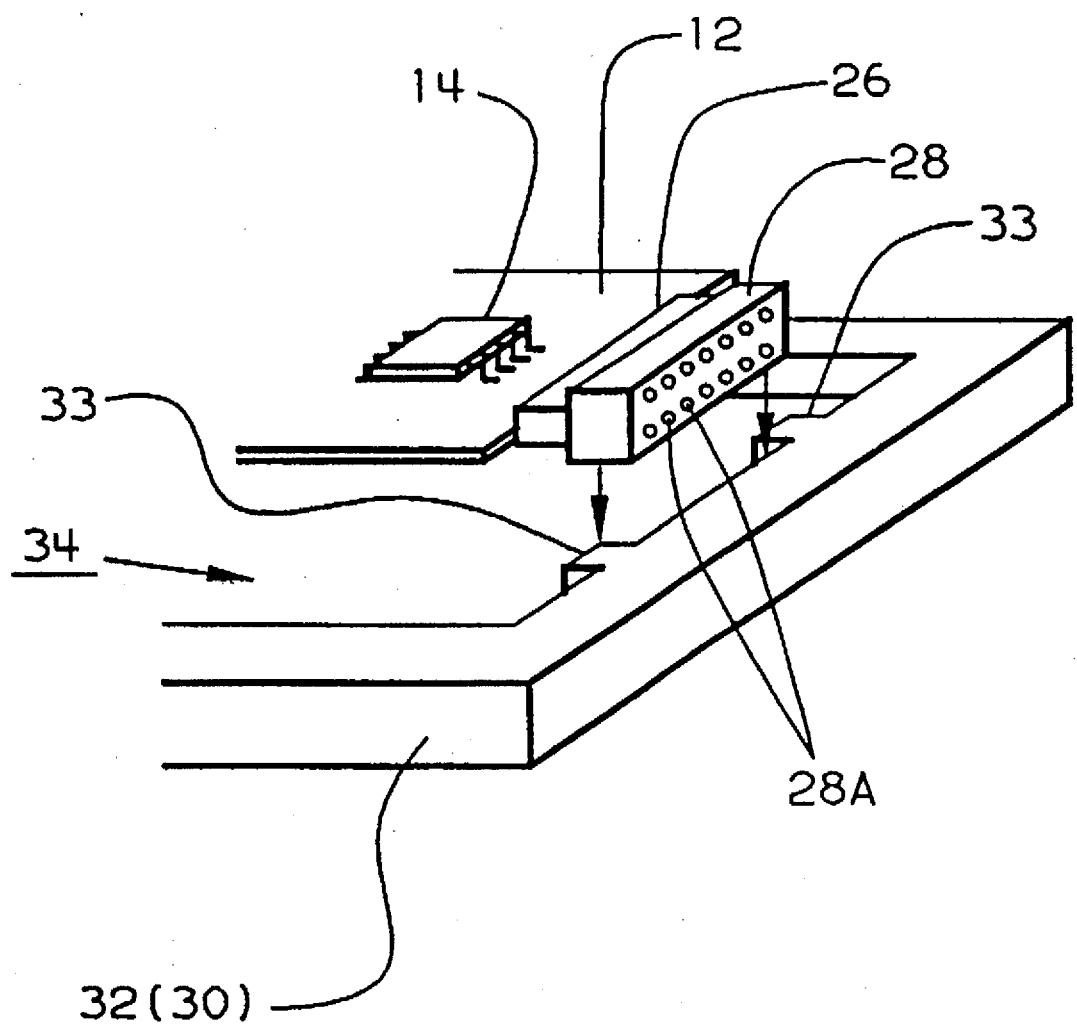
FIG. 3 is a perspective view showing part of the metal mold for the interconnection card related to the first embodiment.

As shown in FIG. 3, to prevent the displacement of connector 28 in the width direction, projecting walls 33 are provided on the side walls of top shell 30 and/or bottom shell 32. connector 28 is fitted between projecting walls 33, and wiring board 12 is positioned in cavity 34. At this point, the vertical face of connector 28 in which holes 28A are formed is closely contacted with the side walls of top shell 30 or bottom shell 32, and both end faces of connector 28 are closely contacted with projecting walls 33, so that the resin material does not flow into holes 28A.

Figure 4:
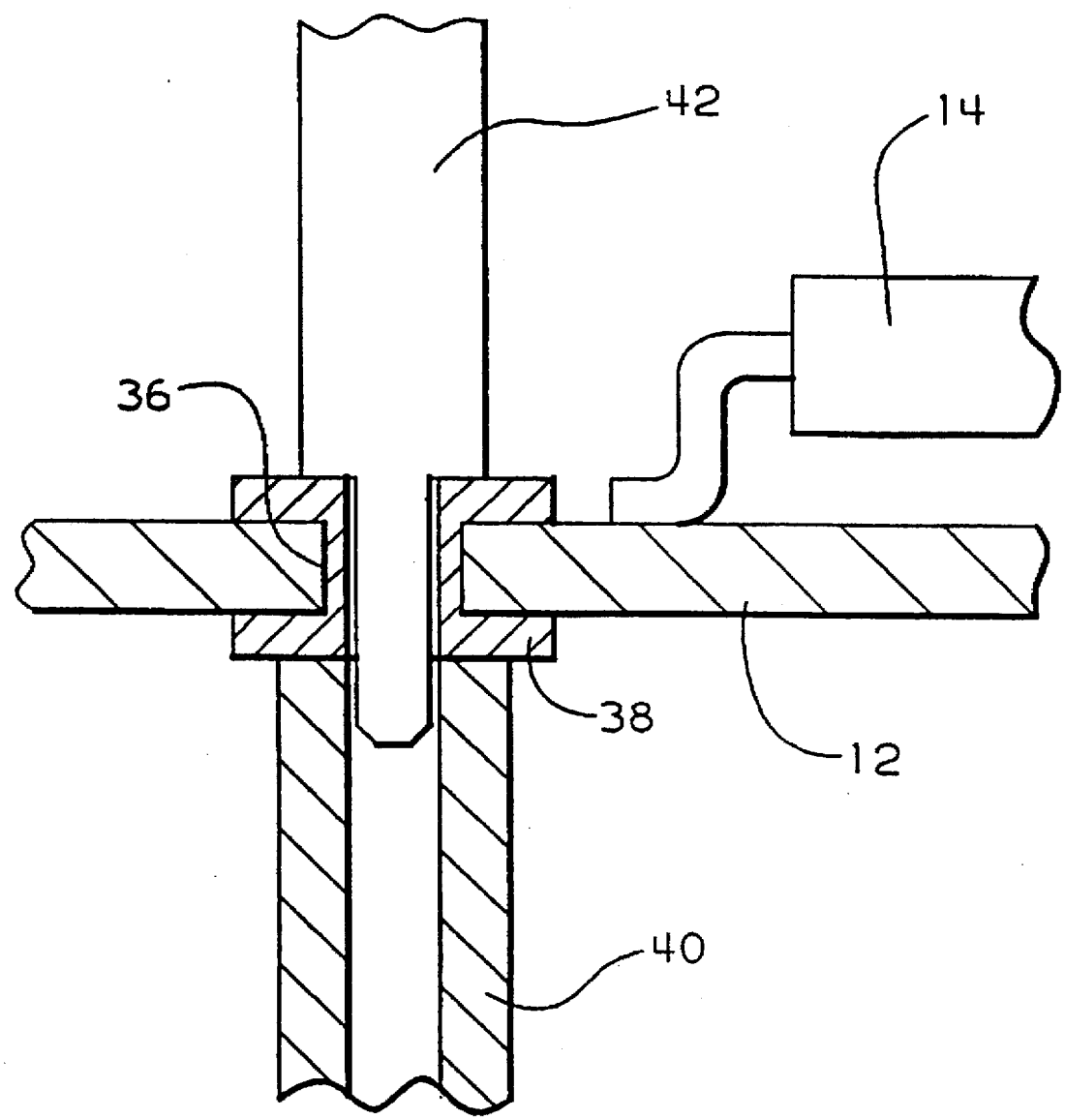
FIG. 4 is a sectional view of the main portion of a variation example of the method for manufacturing the interconnection card related to the first embodiment.

In addition, instead of the positioning by connector 28, or along with connector 28, as shown in FIG. 4, it may be possible that hole 36 is made in wiring board 12, socket 38 is fitted into hole 36, the underside of socket 38 is supported by cylindrical holding body 40 proved so as to project from the cavity surface of bottom shell 32, and tapering holding pin 42 provided so as to project from the cavity surface of top shell 30 is inserted into socket 38 so as to be engaged with holding body 40.

On the other hand, in this embodiment, as shown in FIG. 2, supporting pins 44 having the end portions thereof processed to be flat are provided so as to project from the cavity surfaces of top shell 30 and bottom shell 32, thereby to pinch the substantially central portion and the left end of wiring board 12 from both sides thereof. On the left side of top shell 30 and bottom shell 32, gate 46 communicating with cavity 34 is provided, a resin material is filled from plunger 48 through gate 46.

When the resin material is filled, a large filling pressure acts on wiring board 12. However, wiring board 12 is not deformed, because it is pinched on both sides by supporting pins 44. In addition, since left supporting pins 44 are disposed near gate 46 in which the filling pressure is particularly large, they can effectively hold wiring board 12.

In addition, when the metal mold is opened and interconnection card 10 is taken out, the portions corresponding to supporting pins 44 become holes 18 extending from the surface of sealing layer 16 to wiring board 12.

Second Embodiment of the Interconnection Card

Figure 5:
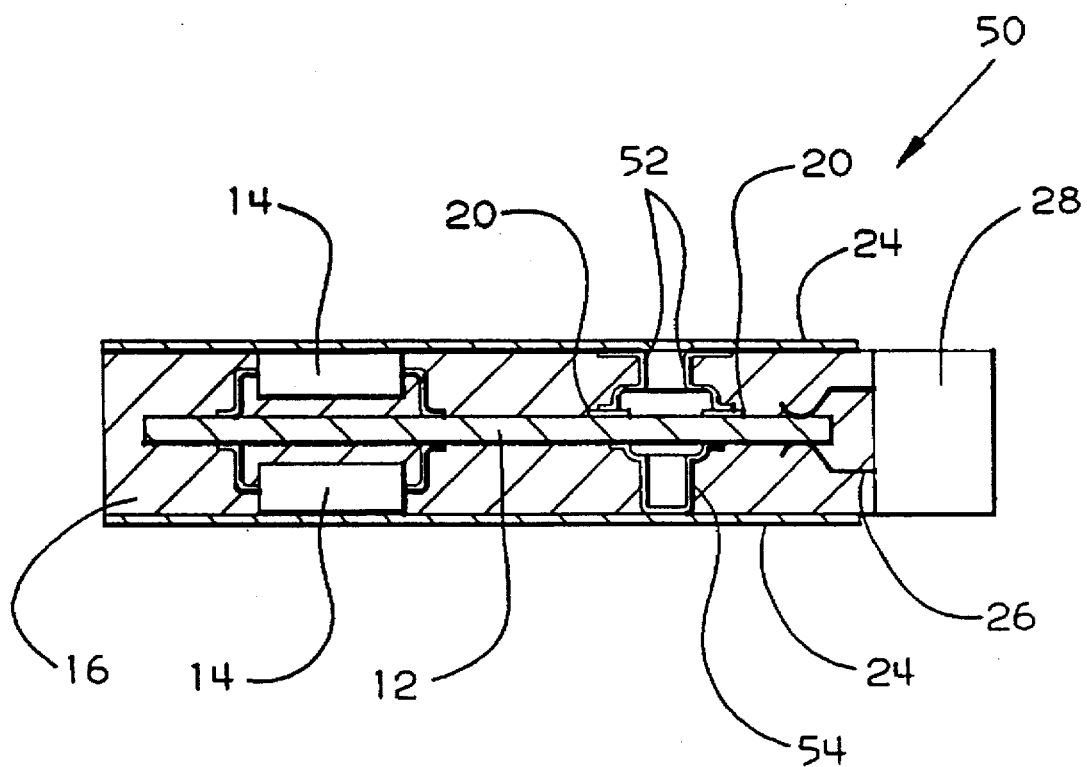
FIG. 5 is a sectional view of the interconnection card related to the second embodiment of the invention.

As shown in FIG. 5, in the second embodiment, ground electrode 20 is mounted on the surface of wiring board 12, and substantially cylindrical metallic rivet 52 is connected to ground electrode 20. Further, on the rear of wiring board 12, metallic rivet 54 having a U-shaped section is also mounted, and electric components 14 are mounted on the surface and the rear of wiring board 12. Metallic rivets 52 and 54, wiring board 12, and electric components 14 are integrally sealed with sealing layer 16 on both sides thereof, and the upper surface of electric components 14 and the surface of metallic rivets 52 and 54 are exposed from the surface of sealing layer 16.

On the other hand, to the right end of wiring board 12, connector 28 is connected through pair of metallic pieces 26. metallic pieces 26 are sealed integrally with wiring board 12 with sealing layer 16, and connector 28 is set so as to have the same thickness as sealing layer 16.

In addition, metallic sheath plates 24 are applied to both surfaces of sealing layer 16 to electrically connect metallic rivet 52 to metallic sheath plate 24, whereby the charges on wiring board 12 are discharged.

Manufacturing the Second Embodiment

The method for manufacturing the interconnection card related to the second embodiment is now described.

Figure 6:
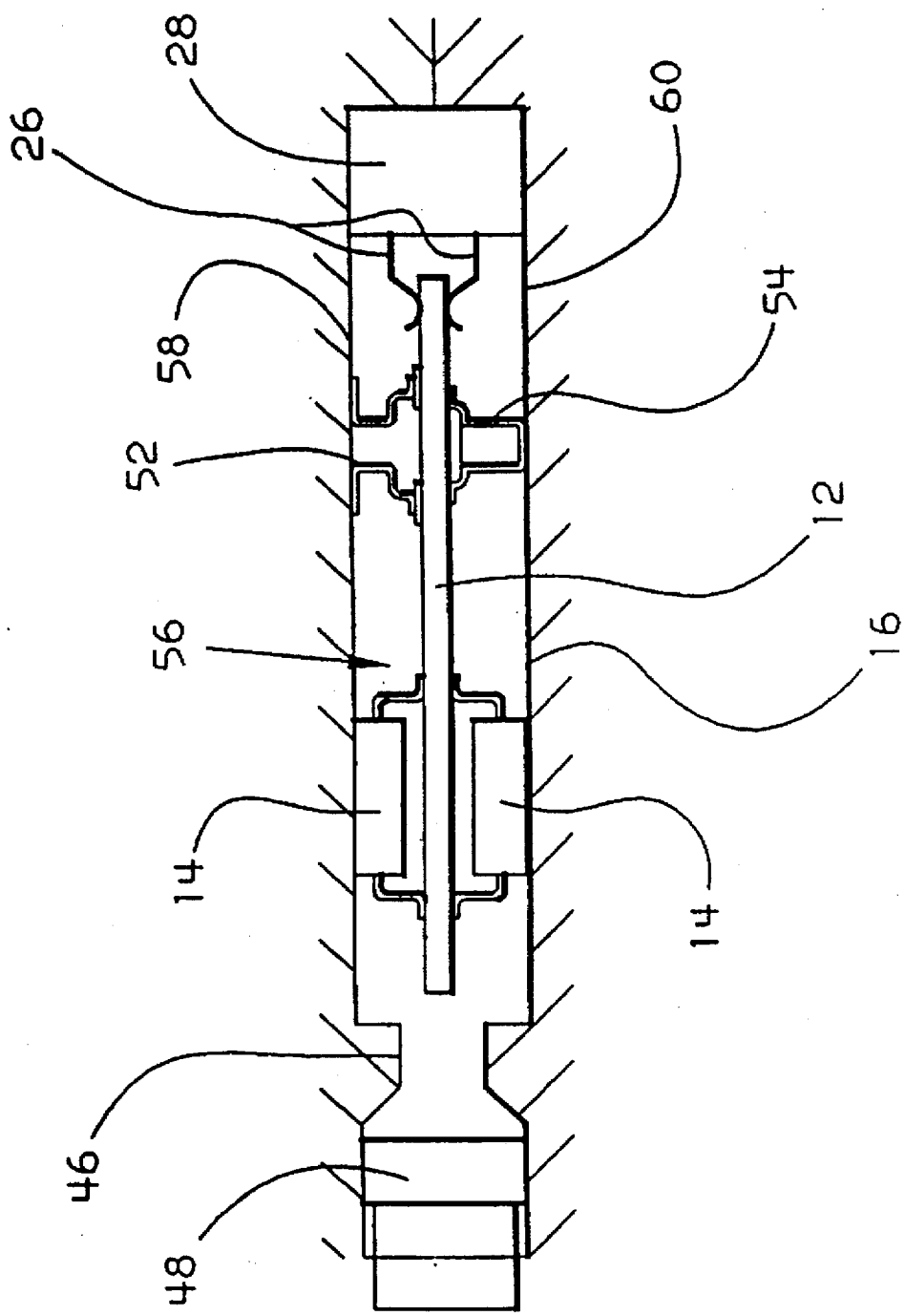
FIG. 6 is a sectional view showing the method for manufacturing the interconnection card related to the second embodiment.

As shown in FIG. 6, connector 28 is disposed in cavity 56, and the end portion of wiring board 12 is supported by metallic pieces 26. By this connector 28, wiring board 12 is positioned within cavity 56.

Further, electric components 14 and metallic rivets 52 and 54 are pressed against the cavity surfaces of top shell 58 and bottom shell 60 to hold wiring board 12 within cavity 56 so as to press and support wiring board 12 in the upward and downward directions.

When a resin material is filled in the next step, large filing pressure acts on wiring board 12. However, wiring board 12 is not deformed, because it is held by electric components 14 and metallic rivets 52 and 54. When the metal mold is then opened to take out interconnection card 50, the surfaces of electric components 14 and metallic rivets 52 and 54 pressed against the cavity surfaces are exposed at the surface of sealing layer 16, because the resin has not crept around the cavity surfaces.

In addition, the components pressed against the cavity surfaces were positioned within the rage of 10 mm from gate 46, and it is effective in preventing the deformation of wiring board 12. Furthermore, since the connection portions between wiring board 12 and electric components 14 are prevented from breaking by the difference in thermal expansion coefficient between the resin material, the connection portions may previously be sealed with a resin material different from the resin material for molding sealing layer 16, thereby to increase the connection strength.

Now, the method for connecting interconnection cards is described.

Figure 7:
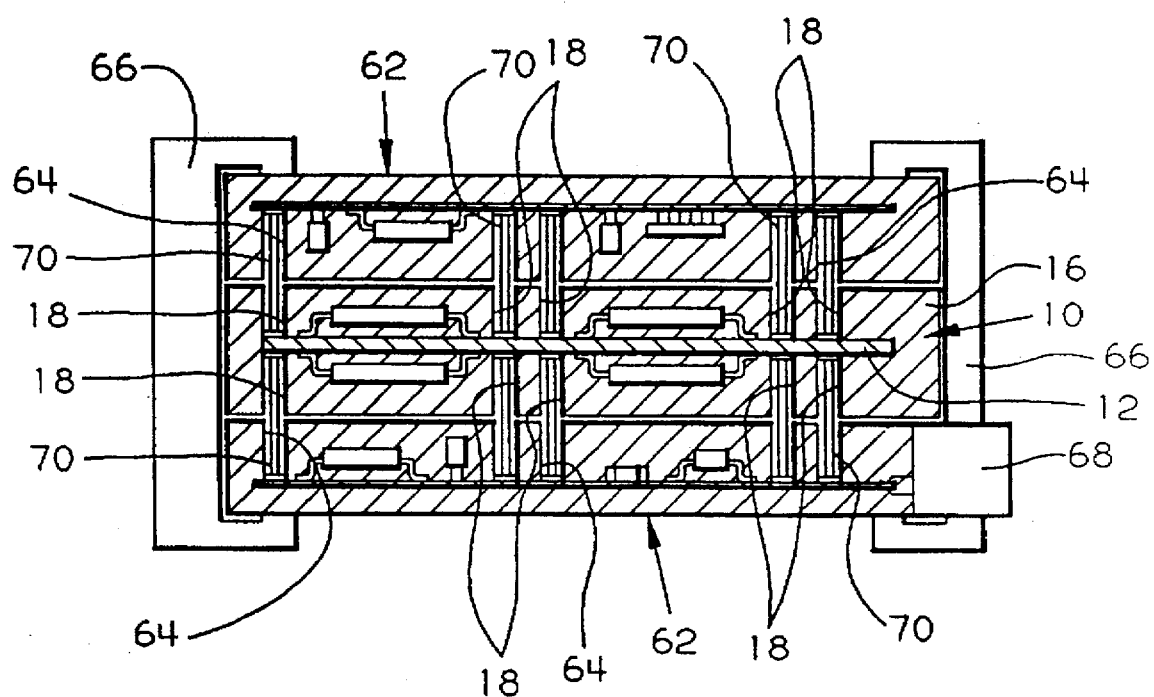
FIG. 7 is a sectional view showing the method of the invention for connecting interconnection cards.

As shown in FIG. 7, above and below an interconnection card 10 having holes 18 formed in the upper and under sides thereof, interconnection cards 62 having holes 64 formed in only one side thereof are disposed. These interconnection cards 10 and 62 are integrally held by holder means 66 disposed at both ends thereof. Alternately, interconnection cards 10 and 62 may be held together by a resin which preferably shrinks in relation to the terminals 70 to electrically connect between the cards. Connector 68 is attached to the bottom interconnection card and electrically connected to a device, not shown.

Metallic terminals 70 are inserted into holes 18 and 64 of interconnection cards 10 and 62 for electrical connection in both the upward and downward directions. Accordingly, in this embodiment, the inconvenience is dissolved in which only one side can be connected when the interconnection cards are placed upon one another, as has been in the conventional ones, and direct connection is enabled through both sides.

Figure 8:
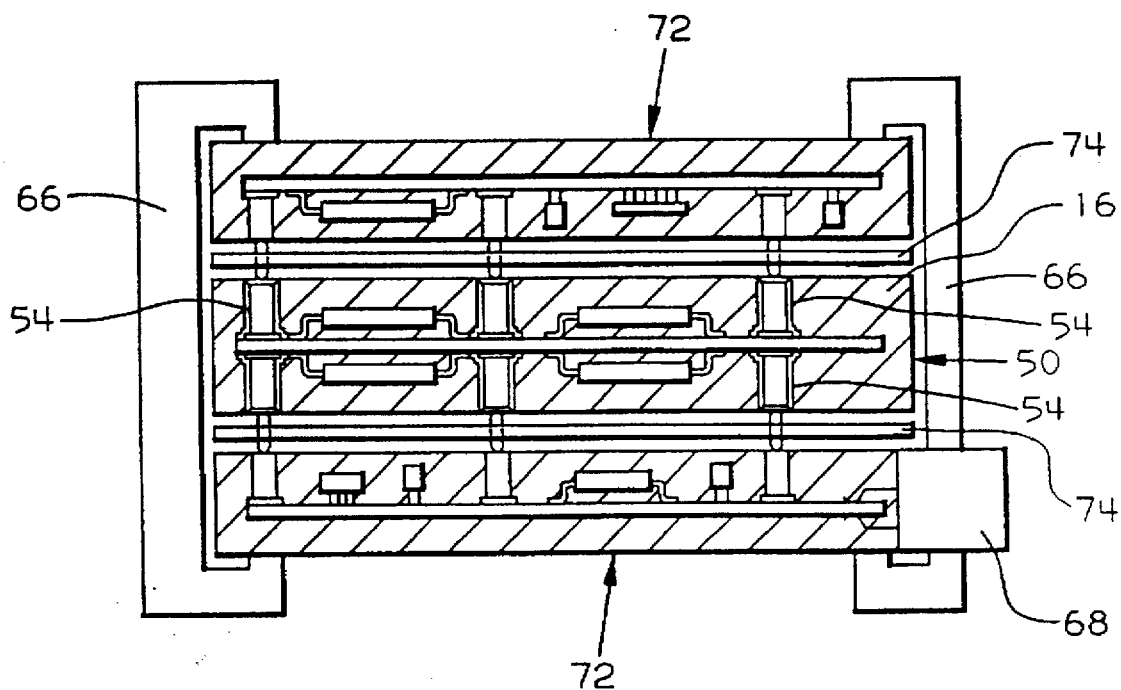
FIG. 8 is a sectional view showing another method of the invention for connecting interconnection cards.

In addition, as shown in FIG. 8, metallic rivets 54 exposed from sealing layer 16 may be directly connected to other interconnection cards 72 or electric components. Further, by placing intermediate connectors 74 between interconnection card 50 and interconnection cards 72, the electrical connection is secured.

Figure 9:
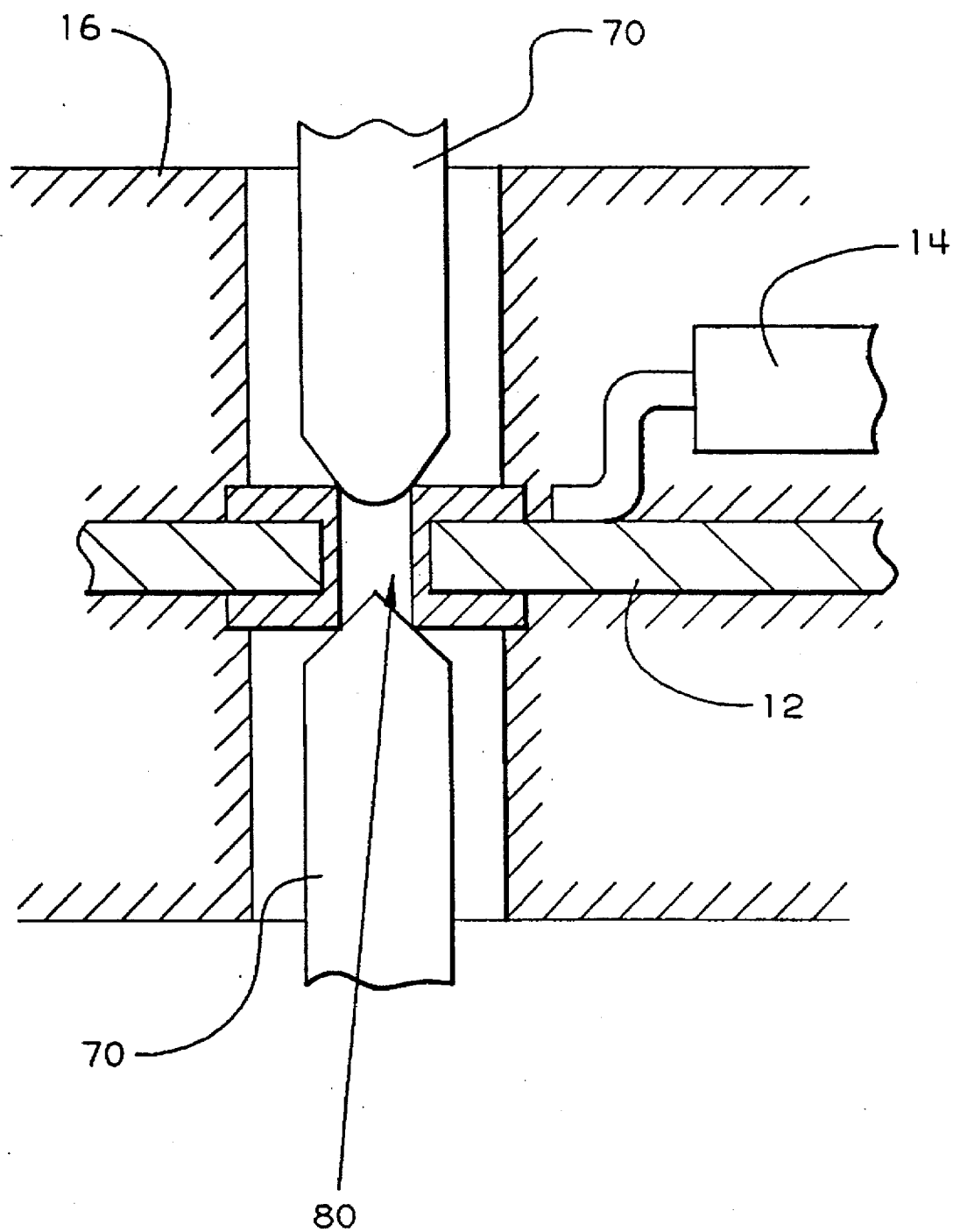
FIG. 9 is a sectional view showing the details of the connection portions of interconnection cards of the invention.
Figure 10:
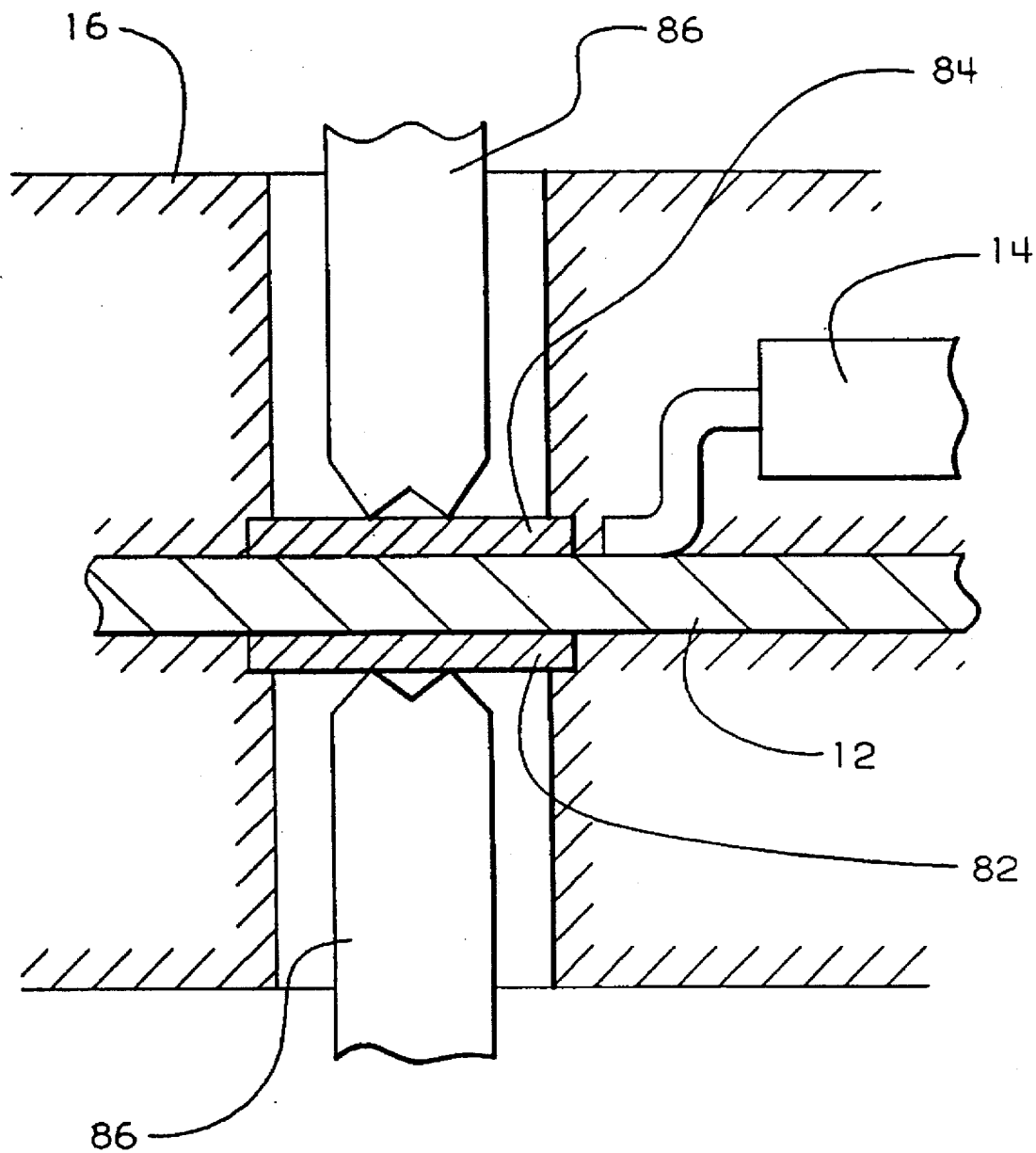
FIG. 10 is a sectional view showing the details of the connection portions of interconnection cards of the invention.

Moreover, as shown in FIG. 9, metallic terminal 70 is electrically connected through hole 80, and as shown in FIG. 10, in the one having ground patterns 82 and 84 disposed on both sides of wiring board 12, the distal end of metallic terminals 86 is cut in the shape of a sealer cutting for easy grounding.

Advantages of the invention

Since the present invention has the above construction, the wiring board is not deformed or damaged by the filling pressure of a resin in the molding process, and three-dimensional electrical connection of interconnection cards is achieved.

I claim:

1. An interconnection card comprising:
   a wiring board; components mounted on the board including electronic components;
   a sealing layer for sealing both sides of the wiring board and having one or more holes extending from a surface of the sealing layer to the wiring board; and
   coupling means for electrically connecting between the board and other members on external sides of the interconnect structure.

2. The card of claim 1 in which coupling means includes one or more contacts on a surface of the wiring board at the holes and conductive terminals inserted into the holes.

3. The card of claim 2 which further comprises:
   other members applied to the sealing layer; and
   means for compressing the terminals against the other members and the wiring board.

4. The card of claim 1 in which coupling means includes one or more components on each side of the wiring board exposed on a surface of the sealing layer with contacts for connecting to other members.

5. The card of claim 4 which further comprises other members applied to the sealing layer in communication with the contacts on the surface of the sealing layer.

6. The card of claim 1 further comprising a connector on at least one end of the card.

7. An interconnect structure, comprising:
   three or more wiring boards;
   components mounted on three or more of the wiring boards including components mounted on both sides of at least one of the wiring boards and the components including electronic components;
   sealing layers for sealing both sides of each wiring board to form interconnect cards; and
   coupling means for electrically connecting between adjacent interconnect cards to form the interconnect structure.

8. An interconnect structure, comprising:
   three or more wiring boards;
   components mounted on three or more of the wiring boards including components mounted on both sides of at least one of the wiring boards and the components including electronic components;
   sealing layers for sealing both sides of each wiring board to form interconnect cards;
   coupling means for electrically connecting between adjacent interconnect cards to form the interconnect structure; and
   an external frame which biases the cards together against terminals that interconnect between confronting contacts of adjacent cards.

9. An interconnect structure, comprising:
   three or more wiring boards;
   components mounted on three or more of the wiring boards including components mounted on both sides of at least one of the wiring boards and the components including electronic components;
   sealing layers for sealing both sides of each wiring board to form interconnect cards;
   coupling means for electrically connecting between adjacent interconnect cards to form the interconnect structure;
   terminals which include springs in holes extending between confronting contacts on the surfaces of adjacent wiring boards and the cards are held together by resin extending between adjacent surfaces of sealing layers on both sides of each card.

10. A method for manufacturing a sealed interconnection card, comprising the steps:
    mounting components on a wiring board including electronic components;
    forming a mold with sides;
    positioning the board in the mold with both sides of the board braced against the sides of the mold; and
    filling the mold with sufficient resin to seal both sides of the board with the resin.

11. A method for manufacturing a sealed interconnection card, comprising the steps of:
    mounting components on a wiring board including electronic components;
    forming a mold with sides;
    positioning the board with both sides of the board braced against the sides of the mold and with one or more of the components in contact with inner surfaces of the sides of the mold; and
    filling the mold with sufficient resin to seal both sides of the board with the resin.

12. The method of claim 11 in which the components include contacts which are pressed against the inner surfaces of the sides of the mold.

13. The method of claim 12 further including the steps of:
    removing the sealed board from the mold; and
    connecting exposed contacts to other members.

14. The method of claim 13 in which the other members include flat conductive plates and further including the step of biasing the plates against the connectors by mechanical springs or a material that shrinks.

15. A method for manufacturing a sealed interconnection card, comprising the steps of:
    mounting components on a wiring board including electronic components;
    forming a mold with sides by providing braces extending from inner surfaces of the sides of the mold to restrain both sides of the wiring board;
    positioning the board in the mold with both sides of the board braced against the sides of the mold; and
    filling the mold with sufficient resin to seal both sides of the board with the resin.

16. The method of claim 15 in which the step of filling includes providing enough resin to seal the components on both sides of the board with resin.

17. The method of claim 15 in which:
    the step of providing braces includes providing pins extending from the inner surfaces of the mold; and
    the method further includes the step of forming holes extending between the board and an exterior surface of a sealing layer on both sides of the board by removing the board from the mold including withdrawing the pins from the resin.

18. The method of claim 17, further including the step of inserting terminals into the holes to enable electrical connection with both sides of the wiring board through the terminals.

19. The method of claim 18 in which the terminals include conductive springs and further including the step of providing other members against sides of the interconnect structure which compress the springs to electrically connect between the other members and the wiring board.

20. The method of claim 19 in which the step of providing other members includes providing metal plates on both sides of the interconnect structure.

* * * * *